United States Patent [19]
Duggan

[11] Patent Number: 5,461,325
[45] Date of Patent: Oct. 24, 1995

[54] PROBE CLAMP ASSEMBLY

[75] Inventor: Richard R. Duggan, Zimmerman, Minn.

[73] Assignee: Marketech, Inc., Elk River, Minn.

[21] Appl. No.: 363,388

[22] Filed: Dec. 23, 1994

[51] Int. Cl.$^6$ ............................. G01R 1/04; G01R 31/04
[52] U.S. Cl. .................. 324/754; 74/109; 74/98; 324/72.5; 439/482; 439/310; 29/593
[58] Field of Search ................ 324/65, 72.5, 73 R, 324/761, 754; 74/109, 98; 439/482, 310; 29/593

[56] References Cited

U.S. PATENT DOCUMENTS 4,232,262  11/1980  Emo et al. .................... 324/722

OTHER PUBLICATIONS

"Lift-N-C Jigs", brochure, Apr. 1993, p. 151.

*Primary Examiner*—Kenneth A. Wieder
*Assistant Examiner*—Barry C. Bowser
*Attorney, Agent, or Firm*—Westman, Champlin & Kelly

[57] ABSTRACT

An assembly suitable for use as an overclamp assembly is provided. The assembly includes a base having a shaft inserted therethrough. The shaft rotates about an axis relative to the base. A center block is pivotably coupled to the shaft for arcuate movement about the axis and relative to the base. A longitudinal drive assembly is inserted into the center block and coupled to the shaft. Rotation of the shaft causes the longitudinal drive assembly to traverse a longitudinal path and an arcuate path about the axis. The longitudinal drive assembly includes a holder which is suitable for attachment to a probe arm.

15 Claims, 6 Drawing Sheets

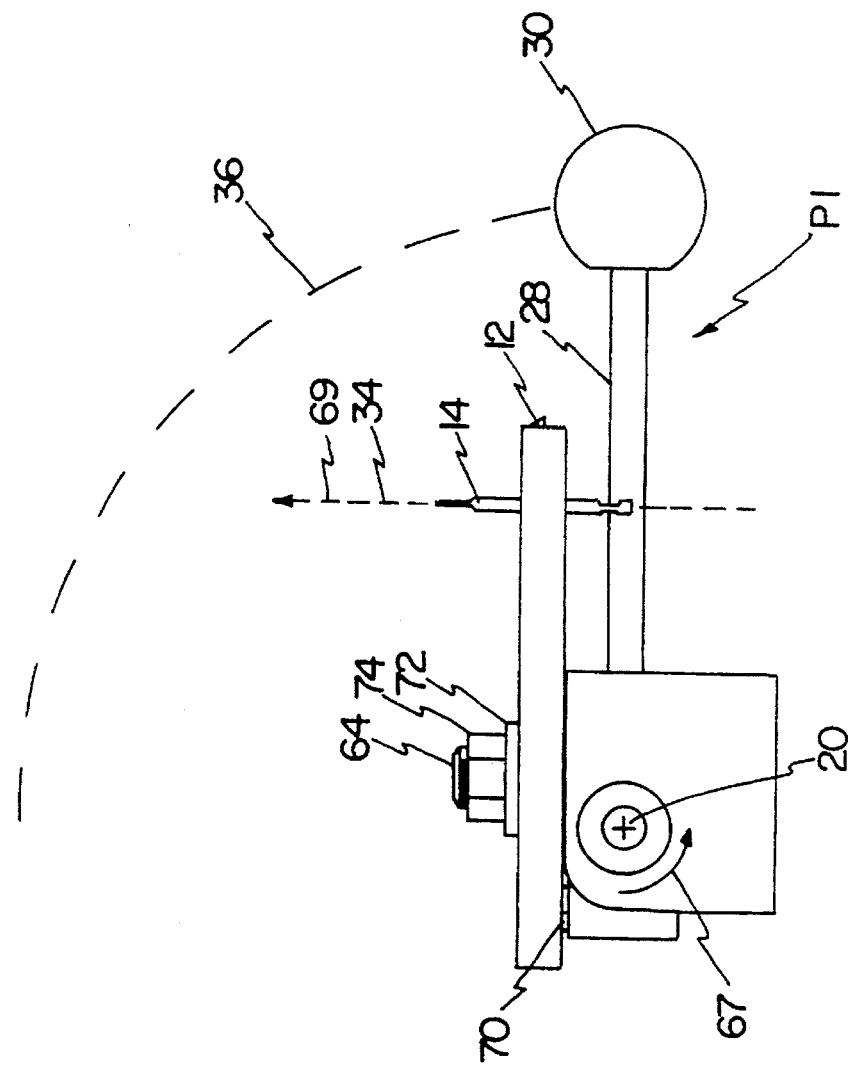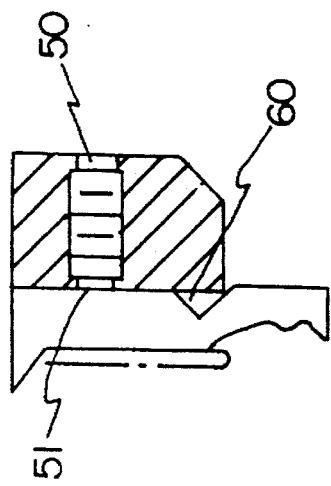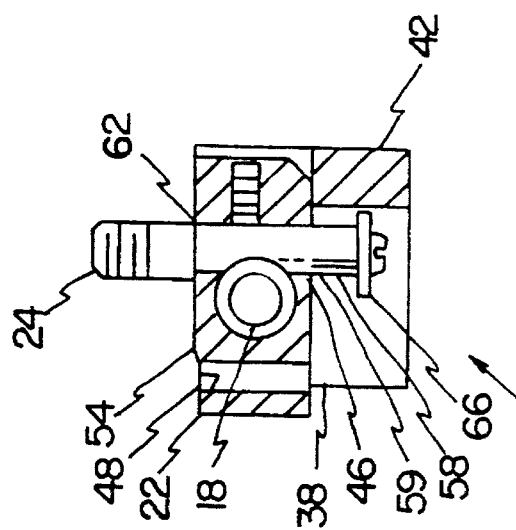

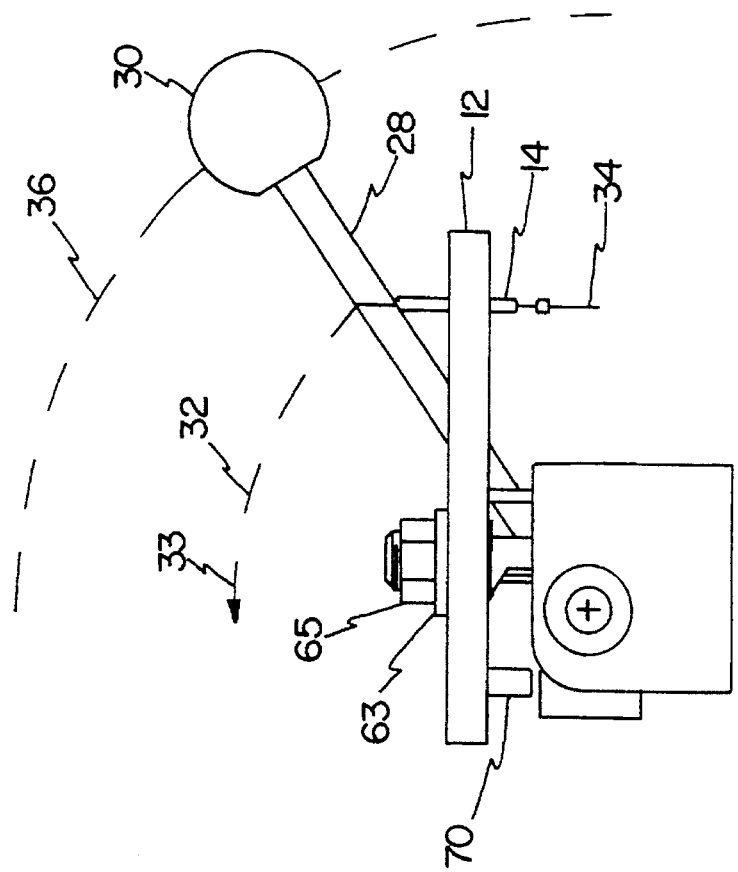
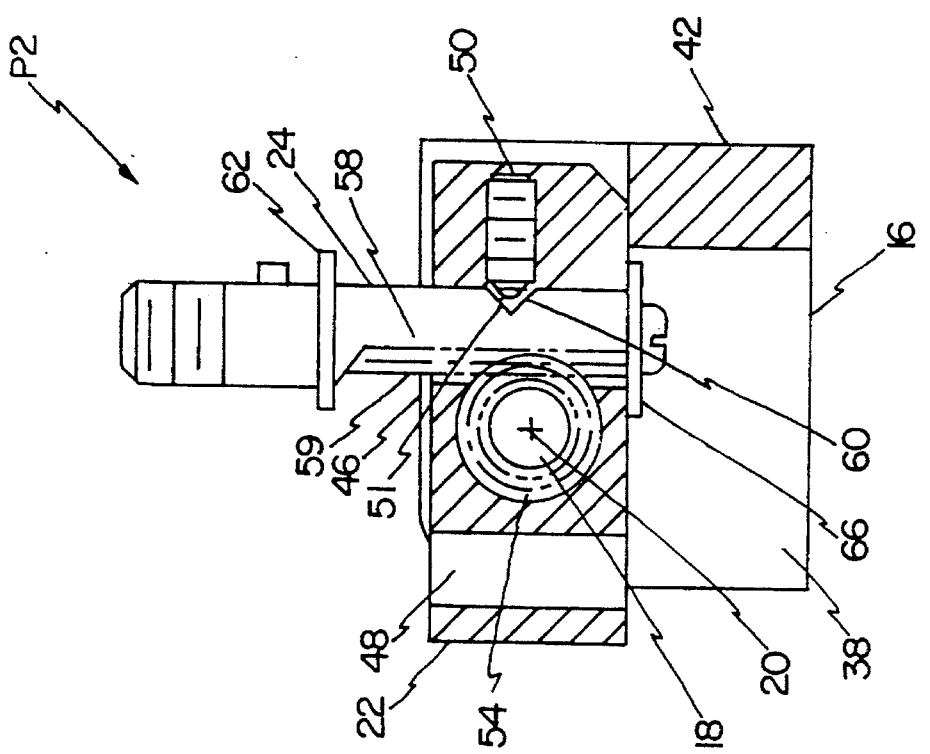
Fig. 7
Fig. 7A

PROBE CLAMP ASSEMBLY

BACKGROUND OF THE INVENTION

The present invention relates generally to devices suitable for use in testing printed circuit boards. Specifically, the present invention relates to an overclamp assembly for positioning a probe over a component on a printed circuit board for testing the component.

Electronic components, such as silicon chip integrated circuits, other semiconductor devices, or connectors are subject to early failure during their life cycle. Thus, producers of printed circuit boards containing electronic components have found it cost-effective to test the printed circuit boards and electronic components prior to shipment to an end-user or the like. By such testing, and by the elimination of failed or under performing electronic components, the reliability of printed circuit boards is greatly enhanced.

Often times, a spring probe is used in testing the electronic components. An operator positions the probe on top of the component. The probe is electrically connected to a test device such as a test computer which applies signals to the component, or receives signals from the component, through the probe. Based on the signals applied and received, the test system measures characteristics of the component.

Sometimes, the operator must hold the probe against the component for a period of time. Also, the operator may be required to test several circuit boards over a given time.

It has been found advantageous to use a clamp to position and hold the probe in place during testing. Several clamps are known. One clamp which functions similar to a drill press, moves the probe through a longitudinal travel path when placing the probe against the component and removing the probe from the component. However, due to the limited range of motion in the longitudinal direction which is conventional with such a clamp, such a clamp-may not provide the necessary longitudinal clearance for exchanging printed circuit boards.

Pivotably mounted probes, on the other hand, move along an arc relative to the component in order to engage, and disengage from, the component. Thus, pivotable clamps swing out of the way and provide necessary clearance to exchange circuit boards. However, the arcuate motion of the probe when descending upon (and engaging) a component is undesirable because other components which are proximate the component set for testing are often in the path of the swinging probe. Further, just as the probe contacts the component, the probe travels through the remaining arc required for full engagement with the component. This causes the probe to "scrape" along the surface of the component under test.

Known clamps that provide the probe with an arcuate motion for clearance and a longitudinal path for positioning and accessibility require multiple and cumbersome steps for proper operation. For example, such clamps typically require the actuation of two or more levers in order to move the clamp into and out of engagement with the component. Such additional steps reduce the efficiency of an operator when testing printed circuits over a given period of time.

SUMMARY OF THE INVENTION

The present invention provides an assembly suitable for use as an overclamp assembly. The assembly includes a base having a shaft inserted therethrough. The shaft rotates about an axis relative to the base. A center block is pivotably coupled to the shaft for arcuate movement about the axis and relative to the base. A longitudinal drive assembly is inserted into the center block and coupled to the shaft. Rotation of the shaft causes the longitudinal drive assembly to traverse a longitudinal path and an arcuate path about the axis. The longitudinal drive assembly includes a holder which is suitable for attachment to a probe arm.

BRIEF DESCRIPTION OF THE DRAWINGS

FIG. 1A is a sectioned side view of a portion of the assembly of FIG. 1.

FIG. 6 is a side view of the assembly of FIG. 1 in an orientation.

FIG. 6A is a sectioned side view of a portion of the assembly of FIG. 1 in the orientation of FIG. 6.

FIG. 6B is a-more detailed view of a portion of FIG. 6A.

FIG. 7 is a side view of the assembly of FIG. 1 in another orientation.

FIG. 7A is a sectioned side view of a portion of the assembly of FIG. 1 in the orientation of FIG. 7.

DETAILED DESCRIPTION OF THE PREFERRED EMBODIMENTS

Figure 1:
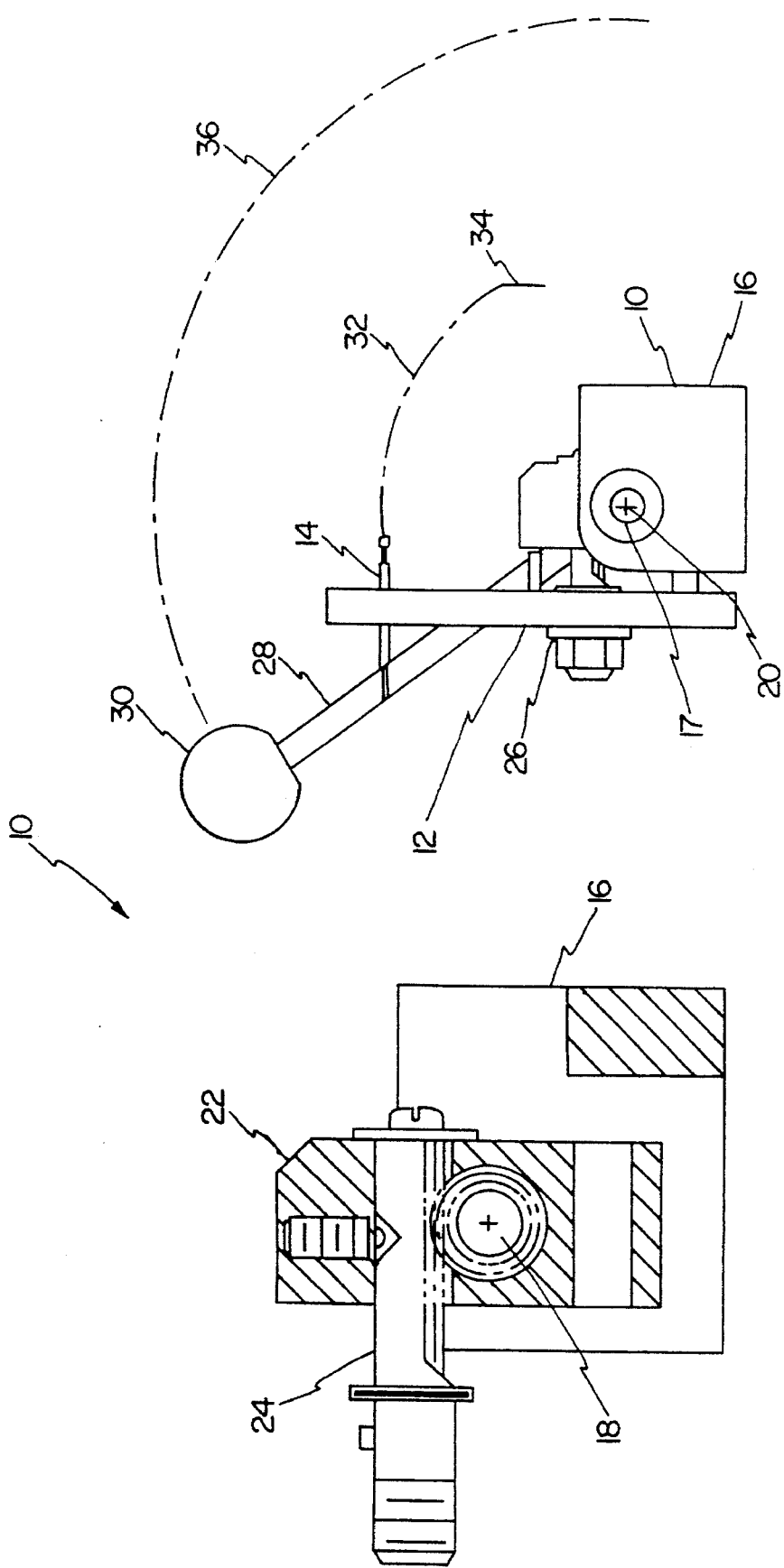
FIG. 1 is a side view of an assembly embodying features of the present invention.

An assembly 10 of the present invention is shown in FIGS. 1 and 1A attached to a probe arm 12 which is, in turn, attached to a probe 14. The assembly 10 includes a base 16, a center block 22, and a longitudinal drive assembly 24. Base 16 has a bore 17 therein which supports a shaft 18. The shaft 18 is rotatable about an axis 20 defined by bore 17.

Center block 22 is pivotably coupled to the shaft 18 for arcuate movement about the axis 20. Longitudinal drive assembly 24, having a holder assembly 26 which is suitable for attachment to the probe arm 12, is coupled to the shaft 18 and center block 22.

The shaft 18 is coupled to a press arm 28 which has a handle 30 at its distal end. The shaft 18 is rotated by movement of press arm 28.

Rotation of the shaft 18 about the axis 20 causes the longitudinal drive assembly 24, and thus the probe arm 12, to traverse an arcuate path 32 about the axis 20 and then a longitudinal path 34. The corresponding movement of the press arm 28 is merely along an arcuate path indicated by 36. These movements are more specifically described later in the specification.

Figure 2:
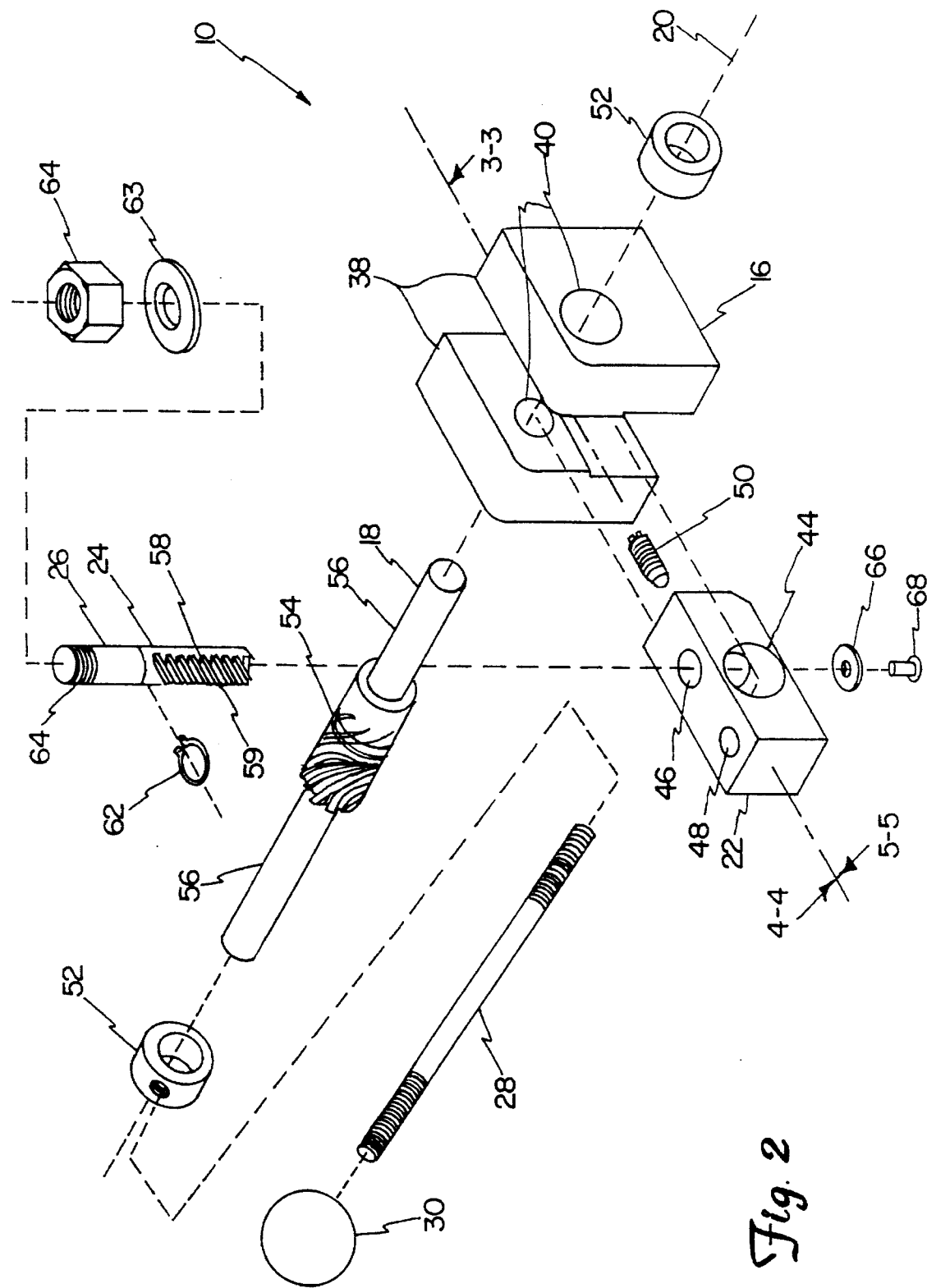
FIG. 2 is an exploded perspective view of the assembly of FIG. 1.
Figure 3:
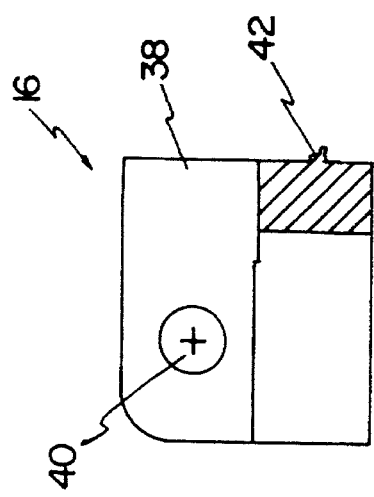
FIG. 3 is a cross-sectional side view of a portion of the assembly taken along section lines 3—3 in FIG. 2.

FIG. 2 is an exploded view of assembly 10 and shows that the base 16 comprises a pair of side plates 38 having generally coaxial holes 40 therein. The side plates 38 are mounted together by a cross-member 42 such that the centers of the holes 40 are generally coincident and parallel. Cross-member 42 is shown in section in FIG. 3 which is taken along section lines 3—3 of FIG. 2. The base 16 is typically fabricated from a metal such as steel, aluminum or cast iron.

Figure 5:
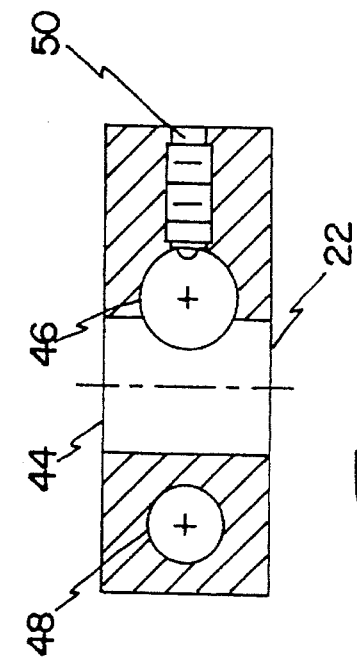
FIG. 5 is a cross-sectional top view of a portion of the assembly taken along section lines 5—5 in FIG. 2.
Figure 4:
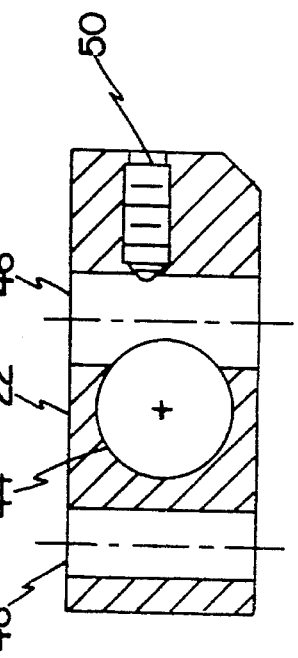
FIG. 4 is a cross-sectional side view of another portion of the assembly taken along section lines 4—4 in FIG. 2.

Referring to FIGS. 2, 4 and 5, the center block 22 is preferably fabricated from a low friction material such as nylon. The center block 22 is configured to fit between the side plates 38 of the base 16 and to rest on the cross-member 42. The center block 22 includes a bore 44 extending through the center block 22. The center block 22 is positioned within the base 16 such that the axis of the bore 44 is coincident with the axis 20 and the holes 40.

The center block 22 also includes a longitudinal bore 46. The bore 44 and longitudinal bore 46 communicate with one another in the center block 22. When the center block 22 is positioned within the base 16, the longitudinal bore 46 is substantially parallel with the side plates 38. The center block 22 also includes a guide bore 48 preferably extending through the center block 22 and parallel to the longitudinal bore 46. A retaining pin 50 is inserted into the center block 22 proximate the longitudinal bore 46 so as to be generally perpendicular to the shaft bore 44 and the longitudinal bore 46.

When the center block 22 is inserted into the base 16, the shaft 18 extends through the holes 40 and the bore 44 and is supported at its ends by shaft end supports 52. The press arm 28 is affixed to one of the shaft end supports 52. The shaft end supports 52 hold the shaft 18 and center block 22 in position relative to one another. The shaft 18 includes a pinion gear 54 positioned on the shaft 18 so as to be inside of the center block 22 at the intersection of the bore 44 and the longitudinal bore 46. Bearing surfaces 56 are located on both sides of the pinion gear 54 and provide low friction rotation within the nylon center block 22. The shaft 18 may be fabricated from any number of materials, but is preferably fabricated from metal.

The longitudinal drive assembly 24 includes a rack 58 which has rack teeth 59 and a notch 60, opposite teeth 59, for engagement with the retaining pin 50. The interaction between notch 60 and retaining pin 50 is described in greater detail in reference to FIGS. 6, 7 and 8.

The holder assembly 26 is attached to one end of the rack 58. The holder assembly 26 includes a support surface 62 and threads 64 (suitable for attachment to the probe arm 12) a retaining washer 63 and a nut 65. Retaining washer 63 and nut 65 are sized to engage threads 64. The rack portion 58 of the longitudinal drive assembly 24 is inserted through the longitudinal bore 46 such that the teeth 59 of rack 58 engage the pinion gear 54. The longitudinal drive assembly 24 is held in place by a washer 66 which is secured to the rack 58 by a screw 68. When the probe arm 12 is threadably attached by threads 64 to the longitudinal drive assembly 24, washer 63 fits over the threads 64 and nut 65 secures the probe arm 12 in place.

The rack portion 58 of longitudinal drive assembly 24 is sized to slide longitudinally within the longitudinal bore 46, but is retained within bore 46 by the support surface 62 and the washer 66. Also, because the pinion gear 54 cooperably engages the teeth 59 of rack 58, rotation of the shaft 18 about axis 20 causes the longitudinal drive assembly 24 to slide longitudinally within bore 46 in the center block 22. The rack 58 is preferably fabricated from a metal so that the nylon center block 22 permits low friction longitudinal movement of rack 58 within bore 46.

Figure 8:
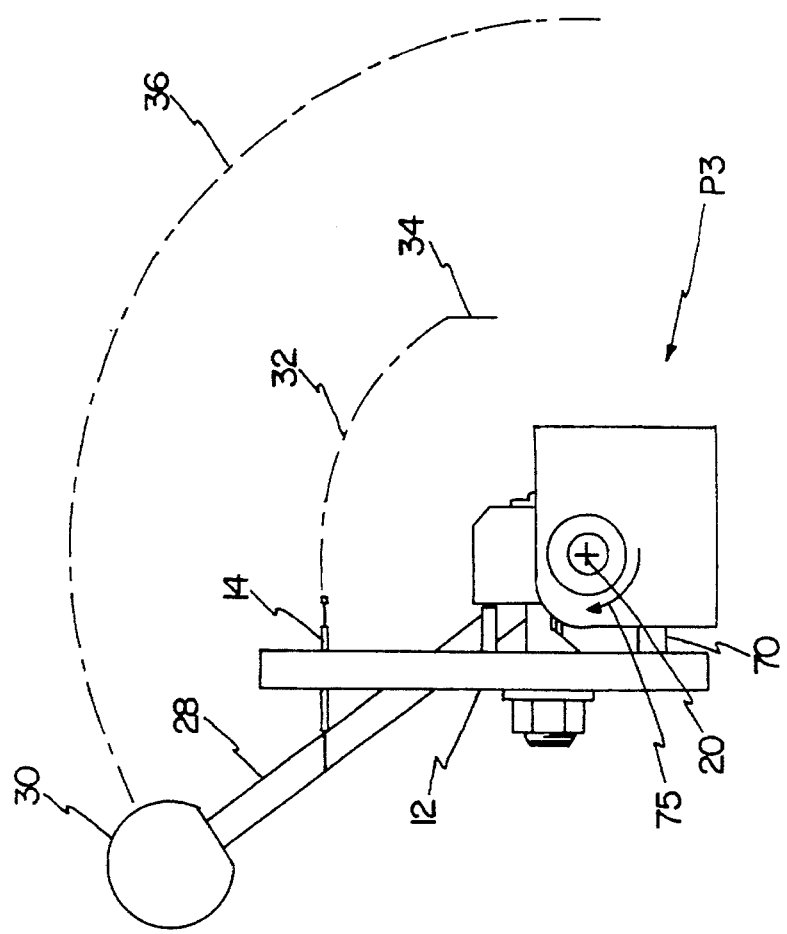
FIG. 8 is a sectioned side view of the assembly of FIG.1 in another orientation.
Figure 8A:
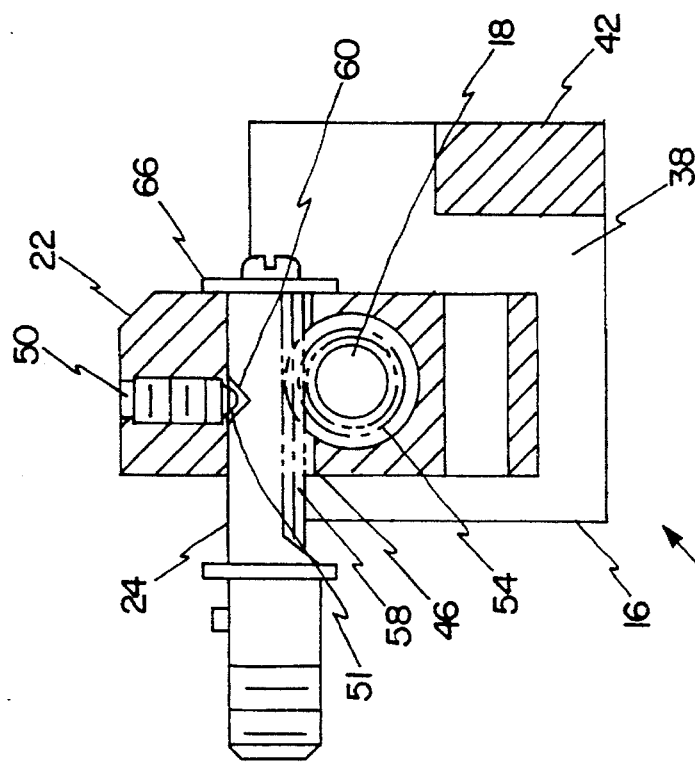
FIG. 8A is a sectioned side view of a portion of the assembly of FIG. 1 in the orientation of FIG. 8.

FIGS. 6, 6A, 6B, 7, 7A, 8 and 8A illustrate movement and operation of assembly 10. FIGS. 6 and 6A show assembly 10 in a first extreme position P1 in which probe 14 is in contact with a component (not shown). Movement of the handle 30 (and hence the press arm 28) along arc 36 causes rotation of the shaft 18 in the direction of arrow 67. Movement of assembly from position P1 to another extreme position P3 (shown in FIGS. 8 and 8A) is briefly as follows. Rotation of the shaft 18 drives movement of the probe arm 12 between a down position P1, as shown in FIGS. 6 and 6A, along the longitudinal path 34 in the direction indicated by arrow 69, to an intermediate position P2, as shown in FIGS. 7, and 7A. Continued movement of handle 30 along arc 36 causes arm 12 to move from the intermediate position P2. The probe arm 12 travels along the arcuate path 32 to up position P3, as shown in FIGS. 8 and 8A. Thus, between the down position P1 and the intermediate position P2, the probe arm 12 travels along the longitudinal linear path 34. Between the intermediate position P2 and the up position P3, the probe arm 12 travels along the arcuate path 32.

The movement of probe 14 from the down (or component engaging) position P1 to the up (or disengaged) position P3 described above is more specifically accomplished as follows. When the probe arm 12 is in the down position P1, as shown in FIGS. 6 and 6A, the support surface 62 rests on top of the center block 22 and guide pin 70 is within bore 48. The stop washer 66 is remote from a bottom portion of the center block 22. Rotation of the pinion gear 54 through arcuate movement of the press arm 28 causes the rack 58 to travel upward moving probe 14 along the longitudinal path 34. This continues until the stop washer 66 is urged against the bottom portion of the center block 22, at which point the probe arm 12 is in the intermediate position P2 (as shown in FIG. 7). In position P2, guide pin 70 is no longer within bore 48.

Retaining pin 50 includes a spring-loaded detente 51 biased in the direction of longitudinal bore 46. At position P1, as shown in FIGS. 6A and 6B, detente 51 is urged against longitudinal drive assembly 24, but is not engaged with notch 60. At the intermediate position P2, notch 60 is in adjacent opposing relation to detente 51, and detente 51 engages the notch 60 so that the longitudinal drive assembly 24 is releasably connected to center block 22 and moves as a unit along with the center block 22, as shown in FIG. 7A.

Continued movement of the press arm 28 along its arcuate path 36 causes the stop washer 66 to "pull" the center block 22 along with the longitudinal drive assembly 24. Thus, the center block 22 and longitudinal drive assembly 24 now move relative to the base 16. Because the center block 22 can only pivot about the axis 20, the center block 22, the longitudinal drive assembly 24, and the probe arm 12 now pivot as a unit relative to base 16 along the arcuate path 32 and in the direction indicated by arrow 33 to the up position P3, as shown in FIGS. 8 and 8A.

Movement of probe 14 from the up or disengaged position P3 to the down or component engaging position P1 is essentially accomplished by reversing the actions described above. Rotation of handle 30 back down along arc 36 causes rotation of shaft 18 in the direction indicated by arrow 75 in FIG. 8. The spring-loaded detente 51 of retaining pin 50 is mated with the notch 60 so the longitudinal drive assembly 24 pivots as a unit with the center block 22 as the center block 22 pivots about the axis 20 along arc 32 toward the intermediate position P2.

At the intermediate position P2, the center block 22 rests against the cross member 42. Continued rotation of the shaft 18 causes force to be exerted by pinion gear 54 against rack 58 urging rack 58 to move longitudinally downward within bore 46. Since center block 22 is precluded from pivoting any further by cross member 42, the spring-loaded detente 51 of the retaining pin 50 is forced back away from the notch 60. This effectively separates longitudinal drive assembly 24 from center block 22 so the longitudinal drive assembly 24 is permitted to travel downward, moving probe 14 along the longitudinal path 34.

The previously described embodiments of the present invention have many advantages and provide many unexpected benefits. Providing movement of probe 14 about first the longitudinal path 34 and then the arcuate path 32 when disengaging probe 14 from the component under test allows the probe 14 to swing out of the way when not in use. This makes the exchange of circuit boards carrying components under test quick and efficient. The longitudinal movement allows probe 14 to disengage from the component under test and drop down directly upon the component under test without "scraping" the component. Further, because the movement is not merely along an arcuate path, the probe 14 can test components that would otherwise go untested because of other proximal components that would block movement of a swinging probe.

Also, because the retaining pin 50 holds the longitudinal drive assembly 24 in place in the intermediate position, the operator can move probe 14 along the arcuate path 32, release handle 30 and position the component under test directly beneath the probe 14 before the probe 14 traverses along the longitudinal path 34. This keeps the probe 14 from dropping down onto the components before they are properly aligned for testing.

Finally, because the probe 14 approaches the components along a longitudinal path, the operator is better able to estimate the final position of the probe 14 when aligning the components. Testing efficiency is further enhanced because the operator is required to make only one motion with a single actuator (the press arm 28) rather than make several motions with a plurality of actuators.

Although the present invention has been described with reference to preferred embodiments, workers skilled in the art will recognize that changes may be made in form and detail without departing from the spirit and scope of the invention.

What is claimed is:

1. An assembly, comprising:
   a base;
   a shaft inserted through the base for rotation about an axis;
   a center block coupled about the shaft for pivotal movement about the axis; and
   a longitudinal drive assembly having a holder suitable for attachment to a probe arm, the longitudinal drive assembly coupled to the shaft and center block so that rotation of the shaft causes the longitudinal drive assembly to traverse a longitudinal path and an arcuate path about the axis.

2. The assembly of claim 1 wherein the shaft includes a pinion gear and the longitudinal drive assembly comprises a rack cooperable with the pinion gear.

3. The assembly of claim 1 wherein the longitudinal drive assembly traverses the longitudinal path relative to the center block and the base, and the longitudinal drive assembly traverses the arcuate path, along with the center block, relative to the base.

4. The assembly of claim 1 and further comprising a press arm attached to the shaft for rotation by an operator.

5. The assembly of claim 1 wherein the center block includes a detente proximate the longitudinal drive assembly for engagement therewith, releasably connecting the longitudinal drive assembly to the center block while the longitudinal drive assembly traverses the arcuate path.

6. An assembly, comprising:
   a pair of base plates each having a hole, the holes being substantially coincident with an axis;
   a shaft inserted through the holes for rotation about the axis, the shaft having a pinion;
   a center block pivotably coupled to the shaft for arcuate motion about the axis, the center block having an axial bore therethrough proximate the shaft; and
   a longitudinal drive assembly inserted through the axial bore, the longitudinal drive assembly having a rack for engagement with the pinion, a stop, and a holder suitable for attachment to a probe arm, wherein rotation of the shaft causes the longitudinal drive assembly to traverse a longitudinal path relative to the base and center block and an arcuate path about the axis and relative to the base.

7. The assembly of claim 6 wherein the center block further includes an axial guide substantially parallel to the bore and wherein the probe arm includes a guide pin for longitudinal motion relative to the center block and within the guide while the longitudinal drive assembly traverses the longitudinal path.

8. The assembly of claim 6 wherein the rack includes a notch and wherein the center block includes a spring-loaded engagement pin yieldably urged against the rack for engagement with the notch while the longitudinal drive assembly traverses the arcuate path.

9. The assembly of claim 6 and further comprising a press arm affixed to the shaft for movement by an operator.

10. A probe clamp assembly, comprising:
    a base having a shaft supporting aperture;
    a shaft rotatably mounted within the shaft supporting aperture, the shaft including a first engaging surface;
    a drive assembly including a holder for holding a probe arm and having a second engaging surface for engaging the first engaging surface of the shaft; and
    a coupling member, coupling the drive assembly to the base such that rotation of the shaft causes the drive assembly to traverse a linear path relative to the base and an arcuate path relative to the base.

11. The probe clamp assembly of claim 10 wherein the coupling member includes a detente for releasably connecting the drive assembly to the coupling member.

12. The probe clamp assembly of claim 10 wherein the base includes a stop, and wherein the coupling member comprises a block, rotatably mounted relative to the shaft and having a bore therethrough, wherein the drive assembly includes a drive shaft movably mounted within the bore.

13. The probe clamp assembly of claim 12 wherein the drive shaft has a block engaging member coupled thereto for engaging the block to support movement of the block with the drive assembly through the arcuate path.

14. The probe clamp assembly of claim 13 wherein the block engages the stop on the base such that the drive shaft traverses the linear path without the block rotating about the shaft.

15. The probe clamp assembly of claim 14 wherein the first engaging surface is a pinion and wherein the second engaging surface is a rack.

* * * * *